United States Patent [19]

Chan et al.

[11] Patent Number: 5,647,124

[45] Date of Patent: Jul. 15, 1997

[54] METHOD OF ATTACHMENT OF A SEMICONDUCTOR SLOTTED LEAD TO A SUBSTRATE

[75] Inventors: Min Yu Chan; Jing Sua Goh, both of Singapore, Singapore

[73] Assignee: Texas Instruments Incorporated, Dallas, Tex.

[21] Appl. No.: 565,224

[22] Filed: Nov. 30, 1995

Related U.S. Application Data

[63] Continuation of Ser. No. 232,975, Apr. 25, 1994, abandoned.

[51] Int. Cl.⁶ ............................................. H05K 3/34
[52] U.S. Cl. ........................ 29/840; 174/52.2; 174/52.4; 228/180.21; 257/735
[58] Field of Search ........................... 29/840; 174/52.2, 174/52.4; 228/180.21; 257/735

[56] References Cited

U.S. PATENT DOCUMENTS

| 4,089,041 | 5/1978 | Lockard ........................... 174/52.4 X |
| 4,477,970 | 10/1984 | Alexander et al. ........................... 29/840 X |
| 4,867,715 | 9/1989 | Roth et al. ........................... 257/735 X |
| 4,868,635 | 9/1989 | Frechette et al. . |
| 4,987,474 | 1/1991 | Yasuhara et al. ........................... 174/52.4 X |
| 5,180,097 | 1/1993 | Zenshi ........................... 228/180.21 |
| 5,196,268 | 3/1993 | Fritz . |
| 5,204,287 | 4/1993 | McLellan et al. . |
| 5,270,492 | 12/1993 | Fukui ........................... 174/52.2 X |

FOREIGN PATENT DOCUMENTS 6-13521  1/1994  Japan ........................... 257/690

OTHER PUBLICATIONS

IBM Tech Discl Bull vol. 32 No. 5B Oct. 1989 pp. 53–54.

*Primary Examiner*—Carl J. Arbes
*Attorney, Agent, or Firm*—Paul Hashim; Jim Brady; Richard Donaldson

[57] ABSTRACT

A lead (10) for a semiconductor device (12) comprising a strip portion (14) comprising a first substantially horizontal portion (18) connected to the semiconductor device (12), a substantially vertical portion (20) connected to the first substantially horizontal portion (18), and a second substantially horizontal portion (22) connected to the substantially vertical portion (20) with at least one hole (16) disposed in the strip portion (14). A method of providing an electrical contact for connecting a semiconductor device (12) to a surface (24) comprising the steps of extending at least one lead (10) from the semiconductor device (12) and slotting the lead (10).

6 Claims, 1 Drawing Sheet

METHOD OF ATTACHMENT OF A SEMICONDUCTOR SLOTTED LEAD TO A SUBSTRATE

This application is a continuation of application Ser. No. 08/232,975, filed Apr. 25, 1995 now abandoned.

TECHNICAL FIELD OF THE INVENTION

This invention relates in general to semiconductor connection devices and more particularly to an apparatus for durable connection of a semiconductor device to a surface.

BACKGROUND OF THE INVENTION

Integrated circuit devices have been housed in dual-in-line plastic packages, referred to as DIP packages, in the bulk of semiconductor manufacture, for many years. These DIP packages have leads which are designed to affix the DIP package to a printed circuit board (PC board). These leads are also generally embedded in the DIP through the use of a leadframe as is known in the art.

Some DIP packages provide leads which extend through holes in the PC board. More recently, surface-mount packaging has been introduced. This technique serves as an alternative to soldering leads in holes in PC boards. As components have moved from through-hole PC board assemblies to surface mount PC board assemblies, the mechanical stability of the solder joint has become more critical. In particular, the solder joint should be more resistant to failure because the solder serves as the securing device which holds the component on the PC board. When the solder joint is particularly rigid, however, leads often crack due to cycles of high and low temperatures.

SUMMARY OF THE INVENTION

Accordingly, a need has arisen for a solder joint which is durable and resistant to failure during variations in environmental conditions. Particularly, a need has arisen for a more durable solder joint during fluctuations in temperature.

One technical advantage of the present invention is a lead which, when used to connect a semiconductor device to a surface, is flexible and resistant to failure over a wide range of environmental conditions. The flexibility of the lead provides a more durable solder joint.

According to the present invention, a lead for a leadframe comprises a strip portion and at least one hole formed in the strip portion.

According to the present invention, a method for providing an electrical contact for connecting a semiconductor device to a surface comprises the steps of extending at least one lead from the semiconductor device and slotting the lead with at least one hole. The lead comprises a first substantially horizontal portion connected to the semiconductor device, a substantially vertical portion connected to the first substantially horizontal portion, and a second substantially horizontal portion connected to the substantially vertical portion.

DETAILED DESCRIPTION OF THE INVENTION

Figure 1:
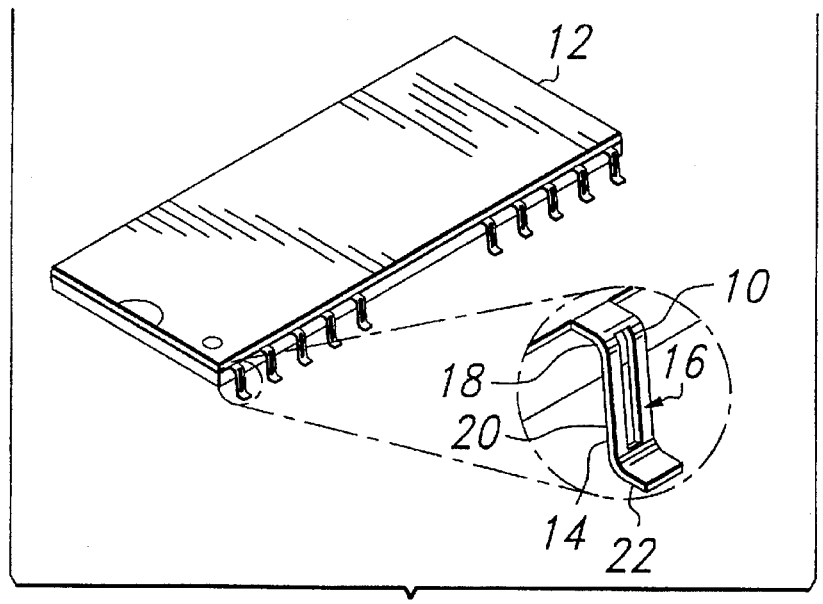
FIG. 1 is an exploded view of a lead extending from a package according to the present invention.
Figure 2:
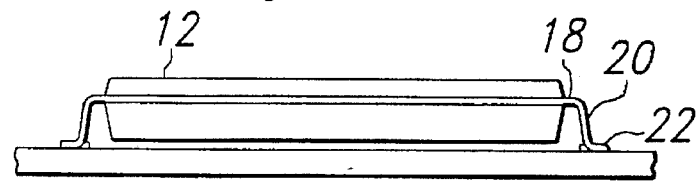
FIG. 2 is a side view of a package surface mounted to a PC board via leads according to the present invention.

Referring to FIGS. 1 and 2, a lead 10 is depicted extending from a semiconductor device 12. Lead 10 may comprise a strip portion 14 and a hole 16. Strip portion 14 is made of metal, but may also be made of other conducting substances. Strip portion 14 may be thin to increase its flexibility. Strip portion 14 may alternatively be as thick as necessary to provide a medium for transporting electrical signals.

In FIGS. 1 and 2, strip portion 14 comprises a substantially horizontal extending portion 18, a substantially vertically extending leg portion 20, and a foot portion 22 which also extends substantially horizontally, as best seen with reference to FIG. 2. Strip portion 14 may have other shapes or may also comprise a plurality of individual components connected together. Strip portion 14 may alternatively comprise one portion or a plurality of different portions.

Hole 16 is disposed entirely within strip portion 14 and, in FIG. 1, is shaped as a slot. Specifically, hole 16 may have a rectangular shape and may be primarily disposed within leg portion 20 of strip portion 14 of lead 10. Other shapes of hole 16 are also possible. For example, circular, oval, square, or trapezoidal shapes may be desired. Additionally, hole 16 may extend through foot portion 22. By providing hole 16 through foot portion 22, a reduced surface area of foot portion 22 is provided to affix lead 10 to a surface as will be described below. Hole 16 may also extend up into extending portion 18. Additionally, more than one hole 16 may be provided in lead 10. For example, two, three or four holes may be desired if, for example, manufacture indicates that such a design is less costly or easier to produce.

Lead 10 provides an advantage when used to surface mount a semiconductor device 12 such as a chip, for example, to a surface 24, as depicted in FIG. 2. Semiconductor device 12 may be a dual in line package (DIP). Semiconductor device 12, however, may comprise any semiconductor device which may be surface mounted to a PC board or the like. Surface 24 comprises a PC board. The composition of surface 24 may vary according to compositions for semiconductor device surfaces. Surface 24 may comprise, for example, a ceramic substrate for hybrid circuits or may also comprise any other device to which semiconductor devices may be surface mounted.

Figure 3:
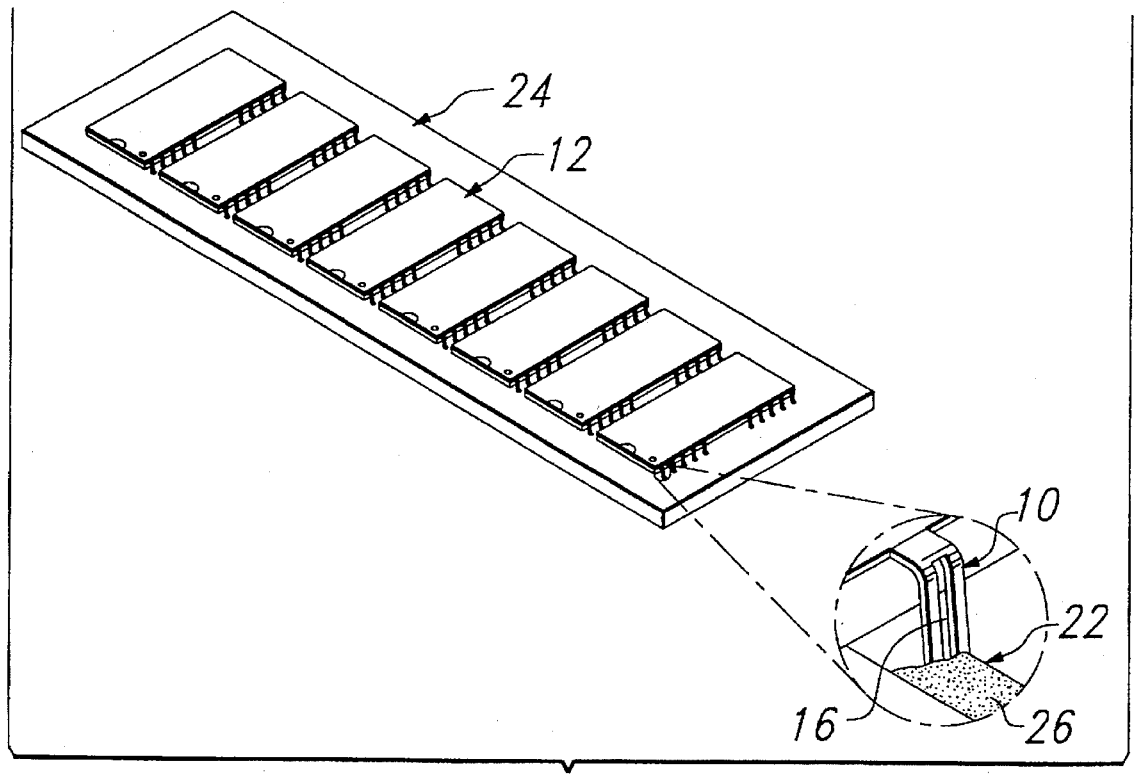
FIG. 3 is an exploded view of a lead according to the present invention extending from a package that has been surface mounted to a PC board through soldering.

FIG. 3 depicts a plurality of semiconductor devices 12 surface mounted to surface 24. Each semiconductor device 12 is surface mounted to surface 24 by soldering its plurality of leads 10 to surface 24.

Referring to FIG. 3, lead 10 according to the present invention has been soldered or otherwise adhered to surface 24. As depicted in FIG. 3, adhesive material 26 may extend over foot portion 22 of lead 10 and even through hole 16. In the embodiment of FIGS. 1–3, adhesive material 26 is solder, e.g., reflow solder consisting of 60/40 Pb/Sn solder which solidifies at 185° C. Adhesive material may also comprise epoxy, or other forms of surface adhesives. In another embodiment, hole 16 may be disposed entirely above adhesive material 26.

Lead 10 of the present invention provides an improved connection between semiconductor devices 12 and surface 24 because of the flexibility which it provides. Semiconductor devices 12 which have been surface mounted on surfaces 26, such as PC boards, for example, are often subject to wide variations in temperature over the duration of their use. This is particularly true for semiconductor devices 12 which are to be used in environments where exposure to outside conditions is particularly common such as in automobiles, airplanes, etc.

Because strip portion 14 has hole 16 formed therein, the portion of strip portion 14 near hole 16 absorbs more of the stresses caused during changes in environmental conditions such as temperature changes. In FIG. 1, for example, foot portion 22 does not move as much due to stresses; rather, extending portion 18, in which hole 16 is disposed, absorbs more of the stresses created by the temperature changes. Because foot portion 22 moves less, the solder joint, or other adhesive material 26 covering foot portion 22, is less likely to crack under the stresses caused by temperature variations. The increased flexibility of strip portion 14 enables the solder joint to be more durable during use in various conditions.

One lead according to the present invention was tested through modeling. A 16 MBIT TSOP (Thin, Small Outline Package) was selected as the semiconductor device 12. The 16 MBIT TSOP was 1 mm thick by 10 mm wide by 18.4 mm long and incorporated a dual-inline gully wing LOC (Lead-on-Chip) leadframe. The leadframe was made of A-42 material at 5 mils thick. The leads from the leadframe were soldered using a reflow solder to an FR-4 board with 60/40 Pb/Sn solder which solidified at 185° C. The low temperature was selected at −65° C. A slotted lead and a non-slotted lead were tested under the same variations in temperature. The Von Mises stresses in the solder was 29% lower for the slotted lead than the non-slotted lead. However, the Von Mises stresses in the lead itself were found to be 27% greater in the slotted lead than the non-slotted lead. This indicates the shifting of stresses from the foot portion 22 of lead 10 to the upper portions of lead 10 as discussed above.

In summary, a lead for connecting a semiconductor device to a surface such as a PC board has been provided. This lead when used to connect a semiconductor device to a surface mount PC board provides a more durable solder joint due to the increased flexibility of the lead itself.

It is apparent that there has been provided, in accordance with the present invention, an apparatus for satisfying the advantages set forth above. Although an embodiment has been described in detail, it should be understood that various changes, substitutions, and alterations may be made herein. Examples are readily ascertainable by one skilled in the art and could be made without departing from the spirit and scope of the present invention as defined by the following claims.

What is claimed is:

1. A method of providing an electrical contact for connecting a semiconductor device to a surface comprising the steps of:

extending at least one lead from a semiconductor device, said lead comprising a first substantially horizontal portion connected to said semiconductor device, a substantially vertical portion connected to said first substantially horizontal portion, and a second substantially horizontal portion connected to said substantially vertical portion;

forming a slot in at least said substantially vertical portion, said slot dividing said vertical portion into at least two substantially parallel leg segments that are connected at slot ends formed in the lead, one of said slot ends terminating in said first lead portion at a location along said lead intermediate of the semiconductor device and the vertical lead portion, said second substantially horizontal portion being connected to said substantially parallel leg segments at one of said slot ends; and bonding the second substantially horizontal portion at said slot end to a bond pad.

2. The method of claim 1 further comprising the step of adhesively securing said lead to the surface.

3. The method of claim 1 further comprising the step of soldering the lead to the surface so that the solder covers at least the second substantially horizontal portion.

4. The method of claim 1 wherein said surface is a printed circuit board.

5. The method of claim 1, wherein bonding of said lead to the bond pad comprises extending a bonding medium over said second substantially vertical portion and through said slot.

6. The method of claim 1, further comprising the step of bonding at least one of said fingers to the bond pad.

* * * * *